(12) United States Patent
Zeng et al.

(10) Patent No.: US 7,166,866 B2
(45) Date of Patent: *Jan. 23, 2007

(54) EDGE TERMINATION FOR SILICON POWER DEVICES

(75) Inventors: Jun Zeng, Mountaintop, PA (US); Gary Mark Dolny, Mountaintop, PA (US); Praveen MurAleedharan, Wilkes-Barre, PA (US)

(73) Assignee: Intersil America, Palm Bay, FL (US)

( * ) Notice: Subject to any disclaimer, the term of this patent is extended or adjusted under 35 U.S.C. 154(b) by 101 days.

This patent is subject to a terminal disclaimer.

(21) Appl. No.: 10/882,387

(22) Filed: Jul. 2, 2004

(65) Prior Publication Data

US 2004/0238903 A1 Dec. 2, 2004

Related U.S. Application Data

(60) Continuation of application No. 10/327,443, filed on Dec. 20, 2002, now Pat. No. 6,759,719, which is a division of application No. 09/792,345, filed on Feb. 23, 2001, now Pat. No. 6,534,347, which is a continuation of application No. 09/344,868, filed on Jun. 28, 1999, now Pat. No. 6,242,784.

(51) Int. Cl.
*H01L 29/15* (2006.01)

(52) U.S. Cl. .................. 257/77; 257/198; 257/495; 438/105

(58) Field of Classification Search ................ 257/485, 257/77, 452, 493
See application file for complete search history.

(56) References Cited

U.S. PATENT DOCUMENTS 4,374,389 A * 2/1983 Temple .................. 257/493
5,489,799 A 2/1996 Zambrano et al. .......... 257/587
5,510,275 A * 4/1996 Malhi .......................... 438/285
5,712,502 A 1/1998 Mitlehner et al. .......... 257/341
5,914,500 A 6/1999 Bakowski et al. ............. 257/77

(Continued)

FOREIGN PATENT DOCUMENTS

EP 0 768 714 B1 9/2003

(Continued)

OTHER PUBLICATIONS

Conti F et al., "Surface Breakdown in Silicon Planar Diodes Equipped with Field Plate", Solid State Electron, vol. 15, pp. 93-105, 1972.

(Continued)

*Primary Examiner*—Howard Weiss
*Assistant Examiner*—John Ingham
(74) *Attorney, Agent, or Firm*—Barnes & Thornburg LLP (57) ABSTRACT

A silicon semiconductor die comprises a heavily doped silicon substrate and an upper layer comprising doped silicon of a first conduction type disposed on the substrate. The upper layer comprises a well region of a second, opposite conduction type adjacent an edge termination zone that comprises a layer of a material having a higher critical electric field than silicon. Both the well region and adjacent edge termination zone are disposed at an upper surface of the upper layer, and an oxide layer overlies the upper layer and the edge termination zone. A process for forming a silicon die having improved edge termination. The process comprises forming an upper layer comprising doped silicon of a first conduction type on a heavily doped silicon substrate, and forming an edge termination zone that comprises a layer of a material having a higher critical electric field than silicon at an upper surface of the upper layer. A well region of a second, opposite conduction type is formed at the upper surface of the upper layer adjacent the edge termination zone, and an oxide layer is formed over the upper layer and edge termination zone.

9 Claims, 7 Drawing Sheets

U.S. PATENT DOCUMENTS

| | | | |
|---|---|---|---|
| 5,939,754 A | 8/1999 | Hoshi | 257/342 |
| 6,242,784 B1 | 6/2001 | Zeng et al. | 257/409 |
| 6,362,026 B1 | 3/2002 | Zeng et al. | 438/140 |
| 6,534,347 B1 | 3/2003 | Zeng et al. | 438/140 |
| 6,759,719 B1 * | 7/2004 | Zeng et al. | 257/409 |

FOREIGN PATENT DOCUMENTS

| | | |
|---|---|---|
| GB | 2317054 | 3/1998 |
| WO | WO 9603774 | 2/1996 |

OTHER PUBLICATIONS

Drabe T et al., "Theoretical Investigation of Planar Junction Termination", Solid State Electronics, Elsevier Science Publishers, Baring, GB, vol. 39, No. 3, pp. 323-328, 1996.

Kao Y. et al, "High Voltage Planer p-n Junctions", Proc. IEEE, vol. 55, pp. 1409-1414, 1967.

Madapura S. et al, "Heteroepitaxial Growth of SiC on Si(100) and (111) by Chemical Vapor Deposition Using Trimethylsilane"; Electrochemical Society, Manchester, New Hampshire, US vol. 146, No. 3, pp. 1197-1202, 1999.

Stengl, R. et al., "Variation of Lateral Doping—A New Concept to Avoid High Voltage Breakdown of Planar Junctions", International Electron Devices Meeting. Washington IEEE, Washington, Dec. 1-4, US, 1985.

Temple, Victor A.K., "Increased Avalanche Breakdown Voltage and Controlled Surface Electric Fields Using a Junction Termination Extension (JTE) Technique", IEEE Transactions on Electron Devices, vol. ED-30, No. 8, pp. 954-957 (Aug. 1983).

Stengl, R., et al. "Variation of Lateral Doping as a Field Terminator for High-Voltage Power Devices", IEEE Trans. Electron Devices, vol. 33(3), pp. 426-428, (1986).

Temple, VAK, Junction Termination Extension, A New Technique for Increasing Avalanche Breakdown Voltage and Controlling Surface Electric Field in p-n Junction:, IEEE International Electron Devices Meeting Digest, Abstract 20.4, pp. 423-426, (1977).

W. Skorupa et al., "Carbon-mediated effects in silicon and in silicon-related materials", Materials Chemistry and Physics 44 (1996) 101-144.

* cited by examiner

EDGE TERMINATION FOR SILICON POWER DEVICES

CROSS-REFERENCE TO RELATED APPLICATIONS

This application is a continuation of U.S. application Ser. No. 10/327,443, filed Dec. 20, 2002 now U.S. Pat. No. 6,759,719, which is a divisional application of U.S. application Ser. No. 09/792,345, filed Feb. 23, 2001, now U.S. Pat. No. 6,534,347, which is a further continuation of application Ser. No. 09/344,868, filed Jun. 28, 1999, now U.S. Pat. No. 6,242,784.

FIELD OF THE INVENTION

The present invention relates to silicon power semiconductor devices and, more particularly, to a silicon semiconductor die having an efficient and reliable edge termination zone.

BACKGROUND OF THE INVENTION

PN junctions within semiconductor devices are not infinite, terminating at the edge zones of a die. This edge effect limits the device breakdown voltage below the ideal value, $V_{brpp}$, that is set by the infinite parallel plane junction. Care must be taken to ensure proper and efficient termination of the junction at the edge of the die; if the junction is poorly terminated, the device breakdown voltage can be as low as 10–20% of the ideal case. Such severe degradation in breakdown voltage can seriously compromise device design and lead to reduced current rating as well. In addition, an inefficient edge termination makes a device unstable and unreliable if the device is operated in a harsh environment or over a long period of time.

Various edge termination techniques have been developed, including, for example, field plate (FP), described in F. Conti and M. Conti, "Surface breakdown in silicon planar diodes equipped with field plate," *Solid State Electronics*, Vol. 15, pp 93–105, the disclosure of which is incorporated herein by reference. Another edge termination approach is field limiting rings (FLR), described in Kao and Wolley, "High voltage planar p-n junctions," *Proc. IEEE*, 1965, Vol. 55, pp 1409–1414, the disclosure of which is incorporated herein by reference. Further edge termination structures utilized variable lateral doping concentration (VLD), described in K. Stengl et al., "Variation of lateral doping as a field terminator for high-voltage power devices", *IEEE Trans. Electron Devices*, 1986, Vol. ED-33, No. 3, pp 426–428, and junction termination extension (JTE), described in V. A. K Temple, "Junction termination extension, a new technique for increasing avalanche breakdown voltage and controlling surface electric field in p-n junction," *IEEE International Electron Devices Meeting Digest*, 1977 Abstract 20.4, pp 423–426, the disclosures of which are incorporated herein by reference.

The purpose of all these various techniques is to reduce electron-hole avalanche generation by lowering the peak electric field strength along the semiconductor surface and thereby shifting the avalanche breakdown location into the bulk of the device. To achieve this goal, the width of the edge termination zone ($L_{edge}$) has to be several times higher than the depletion width ($W_{pp}$) of the parallel-plane portion of the PN junction. For example, if $L_{edge}=2.98W_{pp}$, 98.7% of $V_{brpp}$ can be achieved when an "ideal edge termination," as described in Drabe and Sittig, "Theoretical investigation of plane junction termination," *Solid State Electronics*, 1996, Vol. 3, No. 3, pp 323–328, the disclosure of which is incorporated herein by reference, is used. In practice, a longer $L_{edge}$ than the theoretical value should be used to guarantee device reliability. However, it is very important to point out that, even with very efficient edge termination, electron-hole impact generation at a rate of about $1\times10^{18}$ pairs/cm$^3$.s, still exists along the semiconductor surface.

SUMMARY OF THE INVENTION

A silicon semiconductor die of the present invention comprises a heavily doped silicon substrate and an upper layer comprising doped silicon of a first conduction type disposed on the substrate. The upper layer comprises a well region of a second, opposite conduction type adjacent an edge termination zone that comprises a layer of a material having a higher critical electric field than silicon. Both the well region and adjacent edge termination zone are disposed at an upper surface of the upper layer, and an oxide layer overlies the upper layer and the edge termination zone.

Further in accordance with the present invention is a process for forming a silicon die having improved edge termination. The process comprises forming an upper layer comprising doped silicon of a first conduction type on a heavily doped silicon substrate, and forming an edge termination zone that comprises a layer of a material having a higher critical electric field than silicon at an upper surface of the upper layer. A well region of a second, opposite conduction type is formed at the upper surface of the upper layer adjacent the edge termination zone, and an oxide layer is formed over the upper layer and edge termination zone.

DETAILED DESCRIPTION OF THE INVENTION

The present invention provides more efficient and reliable edge termination for silicon power semiconductor devices compared with currently known techniques. In accordance with the invention, the silicon within an edge zone of a silicon die is replaced with a material having a higher critical electric field ($E_{crit}$) which is the maximum electric field under breakdown condition, and a lower impact ionization generation rate, which is the number of electron-hole pairs generated by an electron or a hole per unit distance traveled.

Replacement of silicon with a suitable material for this purpose can be accomplished in several ways, including, for example, implantation or deposition, or by heteroepitaxial growth, as described, for example, in Madapura et al., "Heteroepitaxial Growth of SiC on Si (100) and (111) by Chemical Vapor Deposition Using Trimethylsilane," *Journal of the Electrochemical Society,* 1999, Vol. 46, No. 3, pp 1197–1202, the disclosure of which is incorporated herein by reference. SiC, because of its high $E_{crit}$ (~12 times higher than Si) and compatible thermal oxidation process with silicon, is a useful replacement material for silicon in a die edge zone. Possible processes to produce the SiC material edge to a controlled depth in a silicon substrate are illustrated in FIGS. 1–4.

Figure 1:
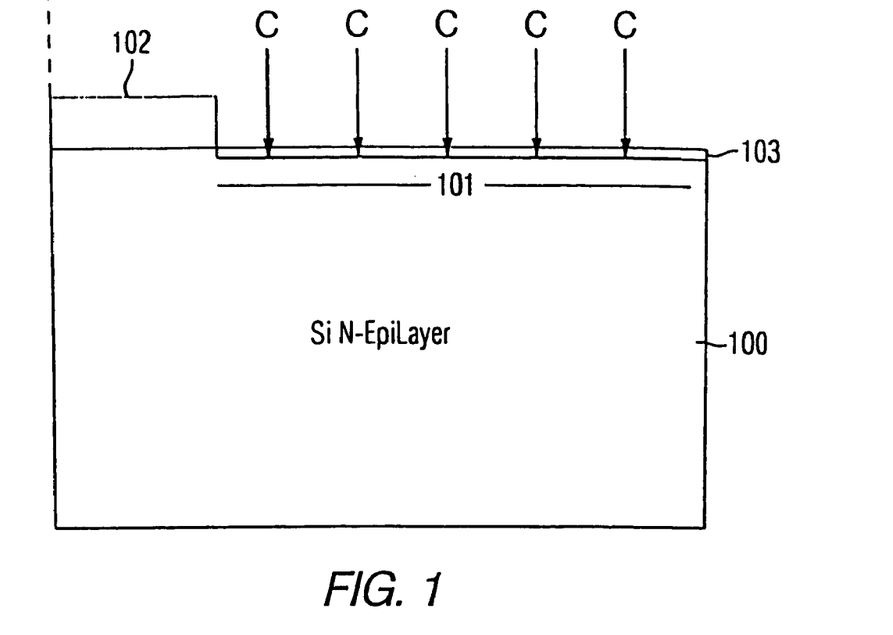
FIG. 1 schematically illustrates the formation of an edge zone in an silicon die by implantation and diffusion.

FIG. 1 illustrates the implantation of carbon, C, into the edge zone 101 of a die 100, shown as an N-epitaxial layer, using an oxide mask 102. A high temperature process, such as laser-promoted local annealing, can be used to activate and diffuse the C implant, resulting in the edge surface layer 103 of silicon die 100 being converted to SiC.

Figure 2:
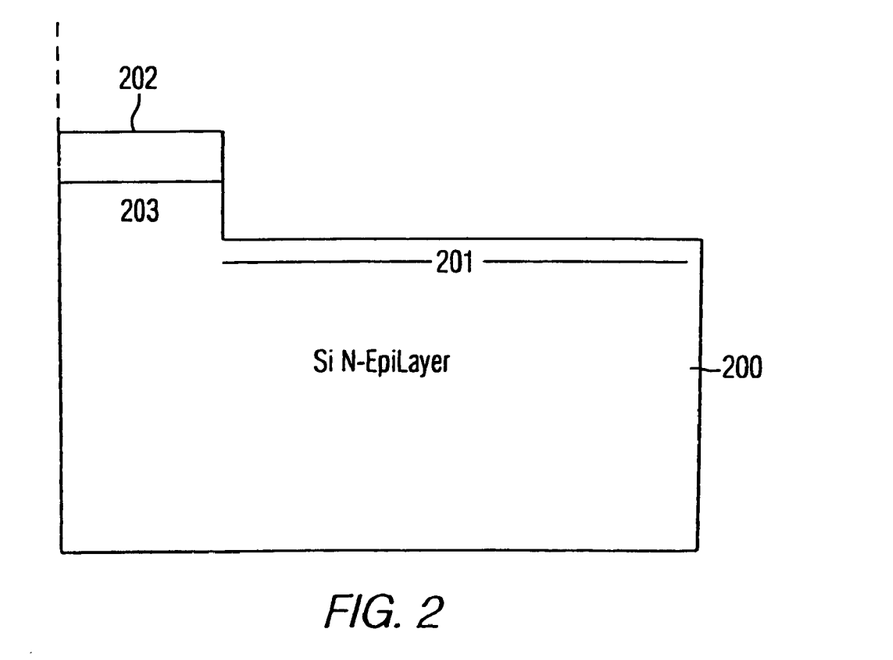
FIGS. 2–4 schematically depict the formation of a silicon die having a silicon carbide edge zone of a selected thickness.
Figure 3:
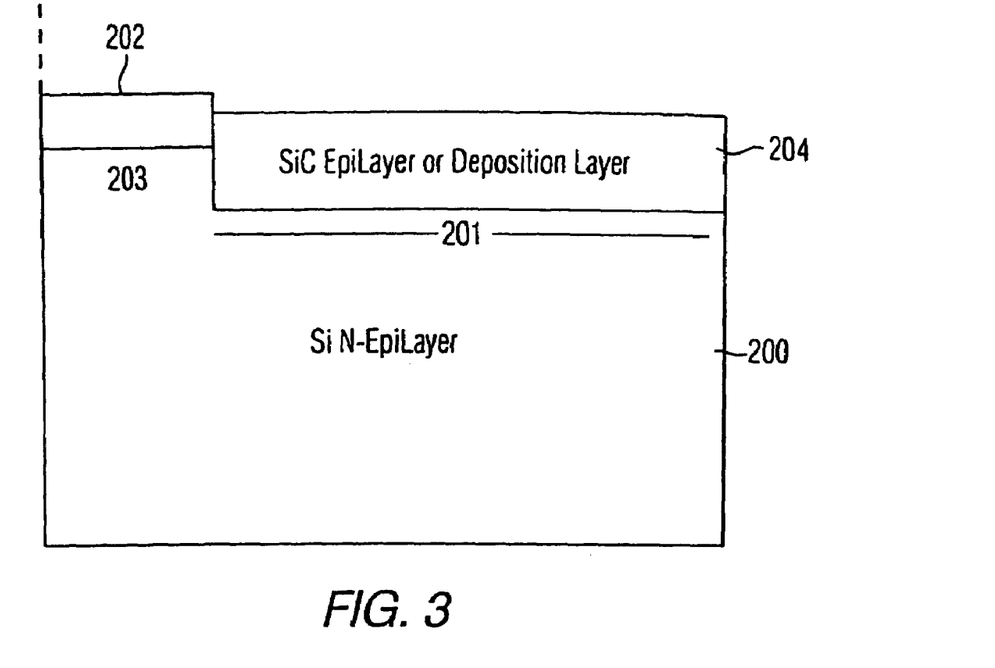
Figure 4:
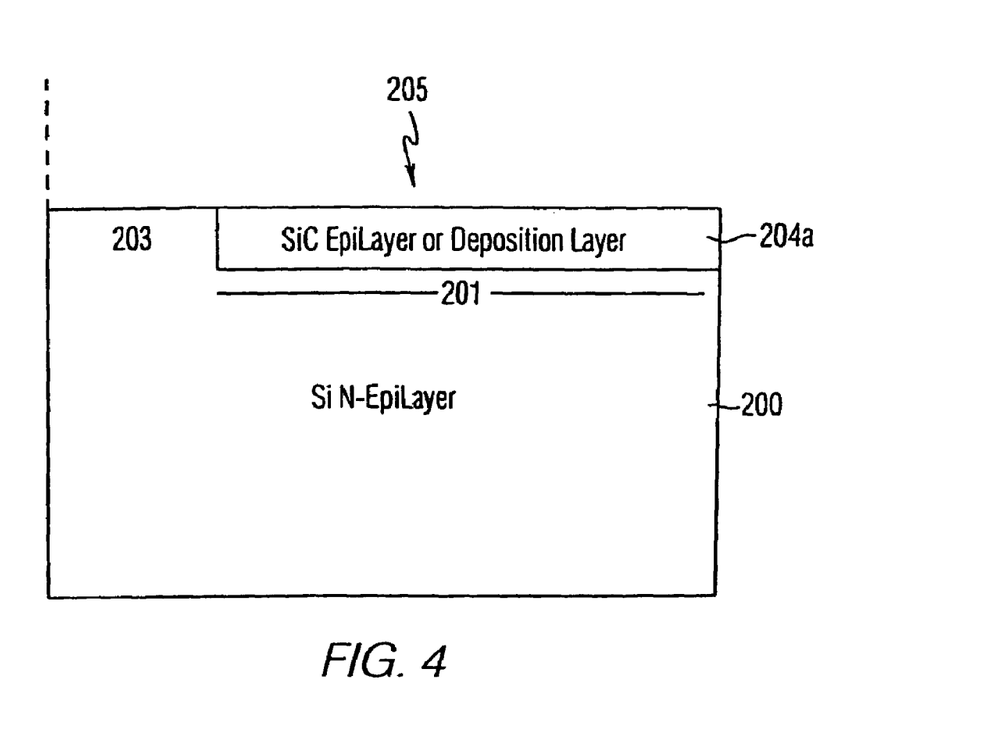

FIGS. 2–4 illustrate another possible process to make a SiC die edge zone. First, a recessed edge zone 201 is etched by either a dry or a wet etch procedure to a specified depth in a silicon die 200, represented as an N-epitaxial layer, using an oxide mask 202 to prevent silicon removal from the active region 203, as shown in FIG. 2. A SiC layer 204, which is of the same conduction type as the epitaxial layer, is formed on recessed edge zone 201 using heteroepitaxial growth or deposition techniques, as shown in FIG. 3. Oxide mask 202 is then removed, and chemical-mechanical polishing (CMP) is performed to produce a fully planarized die 205 that includes SiC edge zone 204a having a selected thickness, as demonstrated in FIG. 4.

Figure 5:
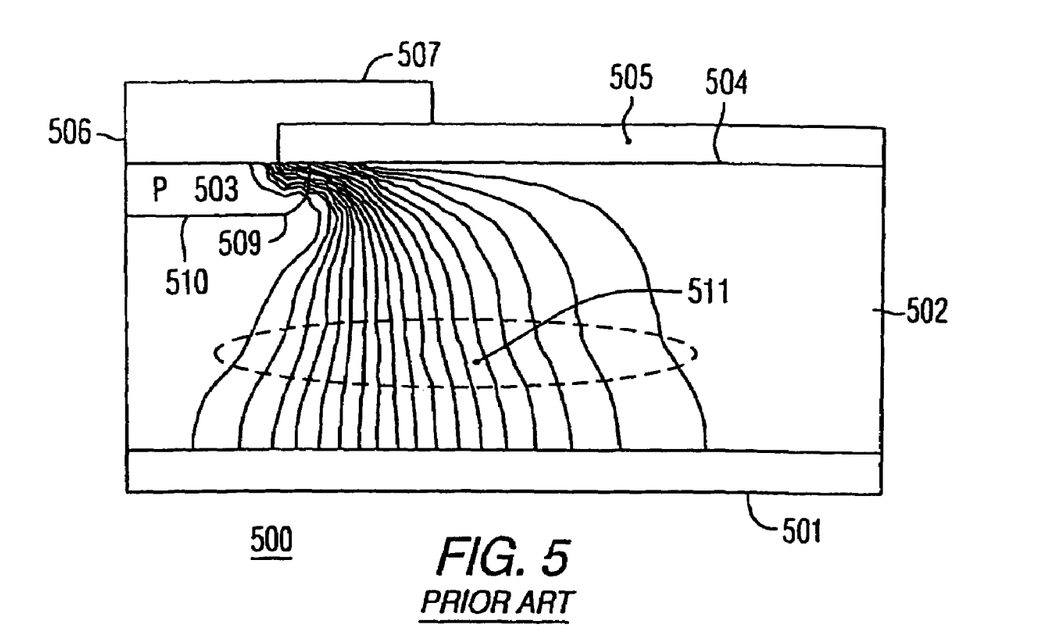
FIGS. 5 and 6 illustrate the leakage current and electron-hole impact ionization generation contours at the onset of edge breakdown for a prior art die having a field plate.
Figure 6:
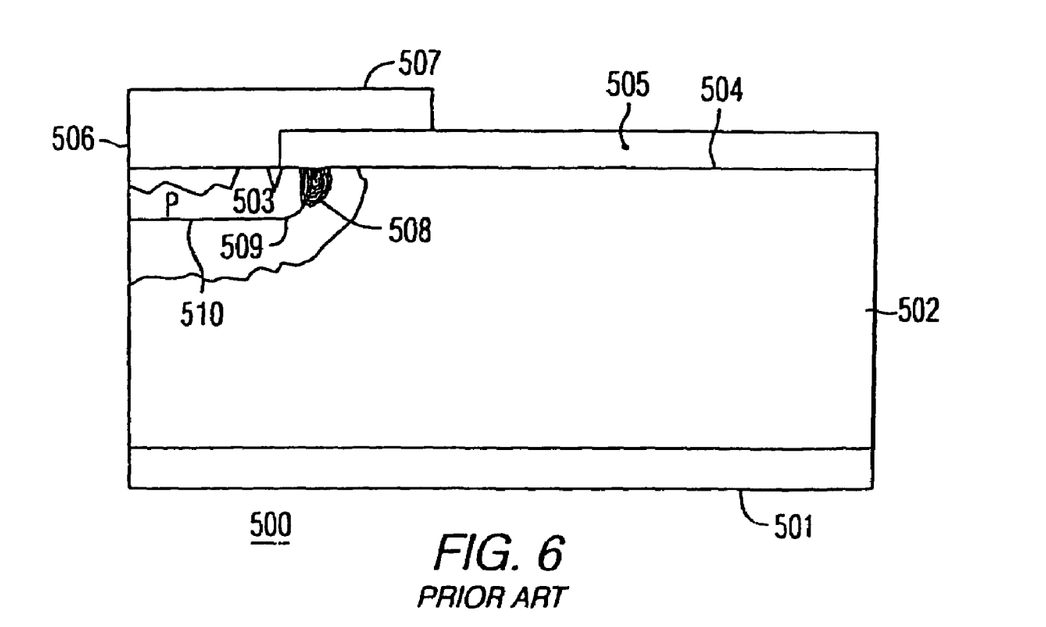

Computer simulations have been performed to verify the concept for a wide range of breakdown voltages, from 600V to 30V. Simulated leakage current and electron-hole impact ionization generation contours, 511 and 508, respectively, at the onset of edge breakdown for a prior art die 500 with field plate edge termination are shown in FIGS. 5 and 6, respectively. Die 500 includes a substrate 501 bearing an N-epitaxial layer 502, in which is implanted a P-well 503. On the surface 504 of epitaxial layer 502 is deposited an oxide layer 505 and, in contact with P-well 503, a front metal layer 506 that is further in contact with a field plate 507. A back metal layer (not shown) is formed on the bottom of substrate 501.

As shown in FIG. 6, the highest electron-hole generation site 508 is located close to the intersection of the PN junction 509 between P-well 503 and N-epitaxial layer 502 and silicon upper surface 504. This is due to the termination of PN junction 509 to form a planar diffused junction having a finite curvature, which causes electric field crowding near upper surface 504 and leads to large impact ionization values at the die edges. Consequently, the breakdown occurs at junction termination edge 508 rather than in the parallel plane portion 510.

The breakdown characteristics of a die 700 of the present invention having a field plate edge and a SiC edge zone formed by C implantation and diffusion have also been simulated. Die 700, schematically depicted in FIGS. 7 and 8, includes a substrate 701 bearing an N-epitaxial layer 702, in which is implanted a P-well 703. At the surface 704 of epitaxial layer 702 is formed a SiC edge zone 705. An oxide layer 706 is formed on SiC edge zone 705, and a front metal layer 707 interconnects P-well 703 with a field plate 708. A back metal layer (not shown) is formed on the bottom of substrate 701.

Figure 7:
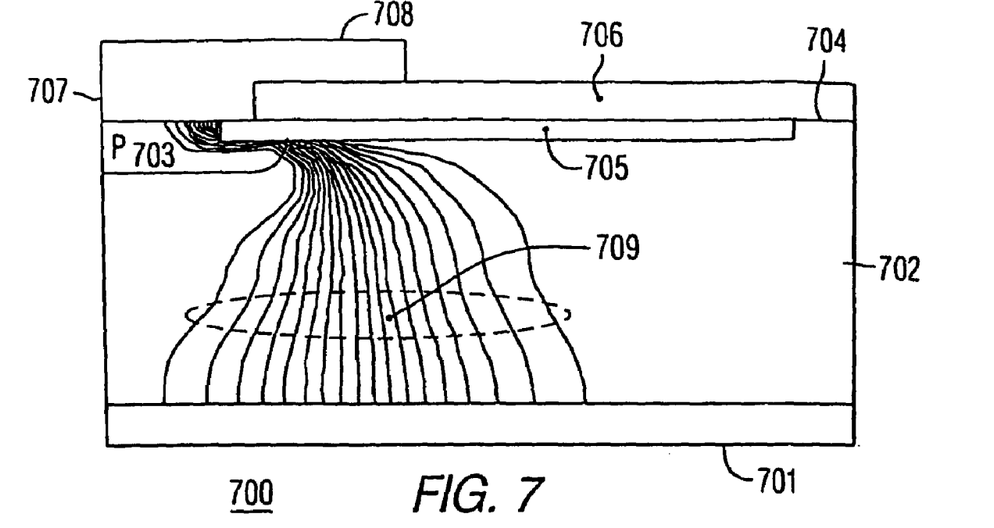
FIGS. 7 and 8 depict the leakage current and electron-hole impact ionization generation contours at the onset of edge breakdown for a die of the present invention that includes a field plate.
Figure 8:
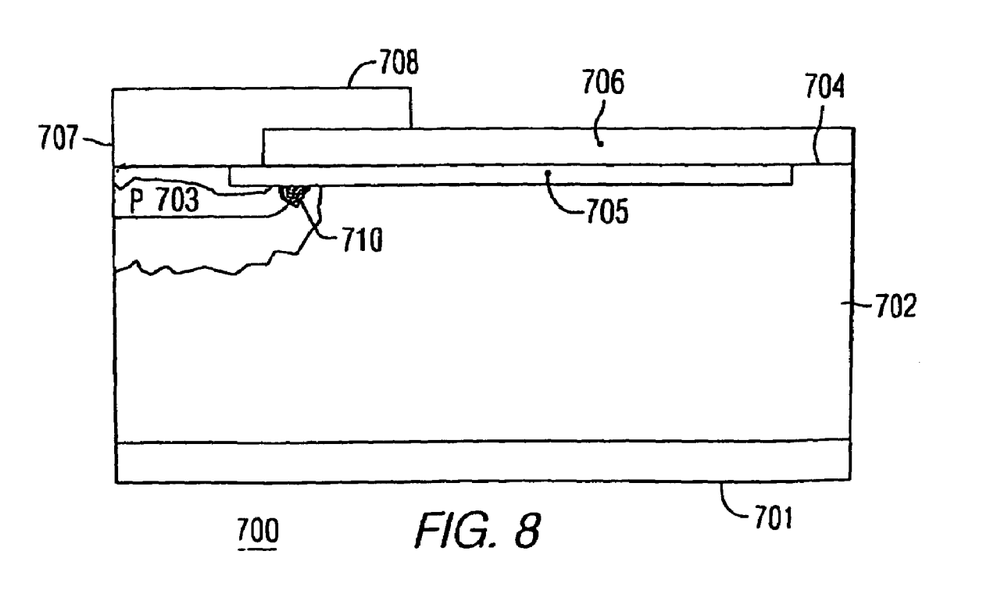

FIGS. 7 and 8 illustrate the simulated avalanche leakage current and impact ionization contours, 709 and 710, respectively, for die 700. The breakdown location 710 is completely screened from the oxide layer 706 by SiC edge zone 705, and there is very little electron-hole generation along upper surface 704. The breakdown voltage for die 700 is higher than that observed for die 500.

Figure 9:
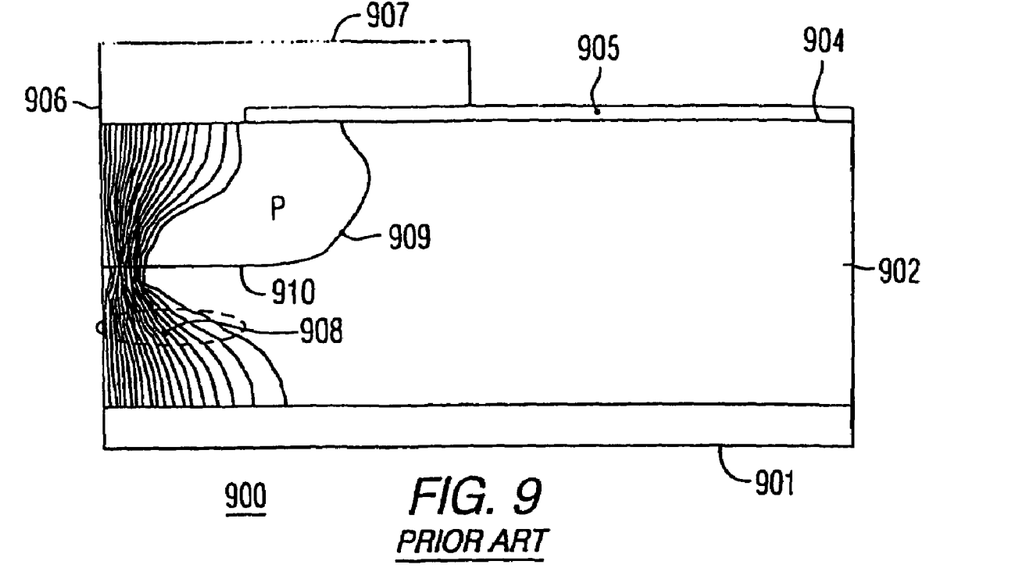
FIGS. 9 and 10 illustrate the leakage current and electron-hole impact ionization generation contours at the onset of edge breakdown for a second prior art die having a field plate, a thin oxide layer, and a deep P-well.
Figure 10:
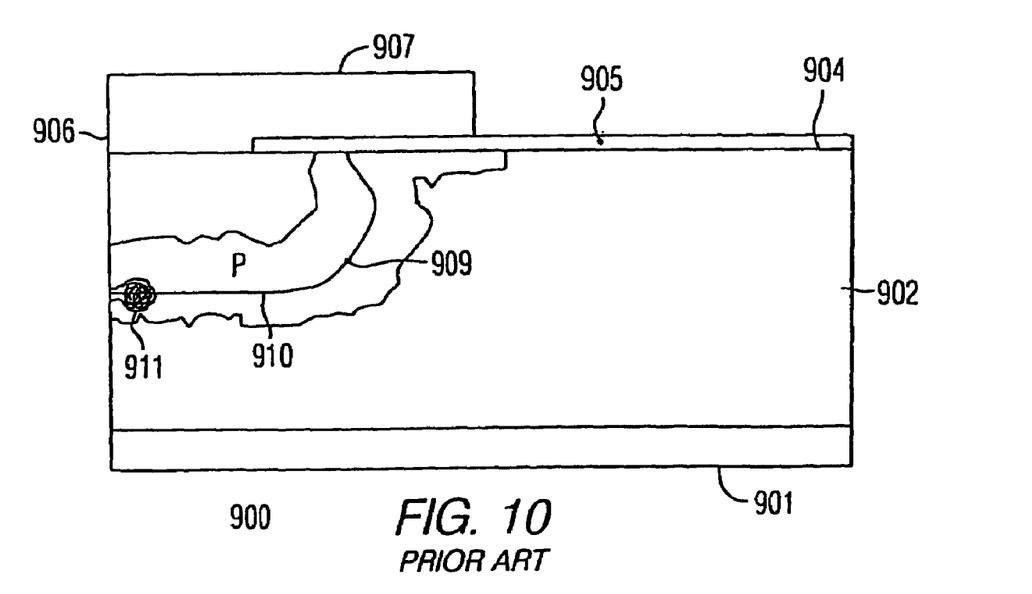

In order to reduce the electron-hole avalanche generation rate along the Si/oxide interface and improve device reliability, a prior art die 900 makes use of a deeper PN junction and thinner oxide to lower the curvature effect. Die 900 with field plate edge termination includes a substrate 901 bearing an N-epitaxial layer 902, in which is implanted a deep P-well 903. On the surface 904 of epitaxial layer 902 is deposited a thin oxide layer 905 and, in contact with P-well 903, a front metal layer 906 that is further in contact with a field plate 907. A back metal layer (not shown) is formed on the bottom of substrate 901.

FIGS. 9 and 10 illustrate the simulated avalanche leakage current and impact ionization contours, 908 and 911, respectively, for prior art die 900. By properly choosing the depth of PN junction 909 and the thickness of oxide layer 905, the breakdown location is moved to the parallel plane portion 910 of PN junction 909. As a result, the device reliability of die 900 can be substantially improved. However, although the avalanche breakdown location is shifted into the bulk silicon, there still exists a certain level of electron-hole generation along the interface 904 between epitaxial layer 902 and oxide layer 905. The simulation gives an impact ionization generation rate at breakdown location 911 of about $1 \times 10^{18}$ pairs/cm$^3$.s and a generation rate at the same voltage of about $1 \times 10^{18}$ pairs/cm$^3$.s at surface 904.

The present invention provides further improvement, without the need for changing junction depth and oxide thickness, over the results obtained with prior art die 900. Die 1100, schematically depicted in FIGS. 11 and 12, includes a substrate 1101 bearing an N-epitaxial layer 1102, in which is implanted a P-well 1103. At the surface 1104 of epitaxial layer 1102 is formed a SiC edge zone 1105 that extends into N-epitaxial layer 1102 to a depth below that of P-well 1103. An oxide layer 1106 is formed on SiC edge zone 1105, and a front metal layer 1107 interconnects P-well 1103. Unlike previously described dies, die 1100 includes no field plate. A back metal layer (not shown) is formed on the bottom of substrate 1101.

Figure 11:
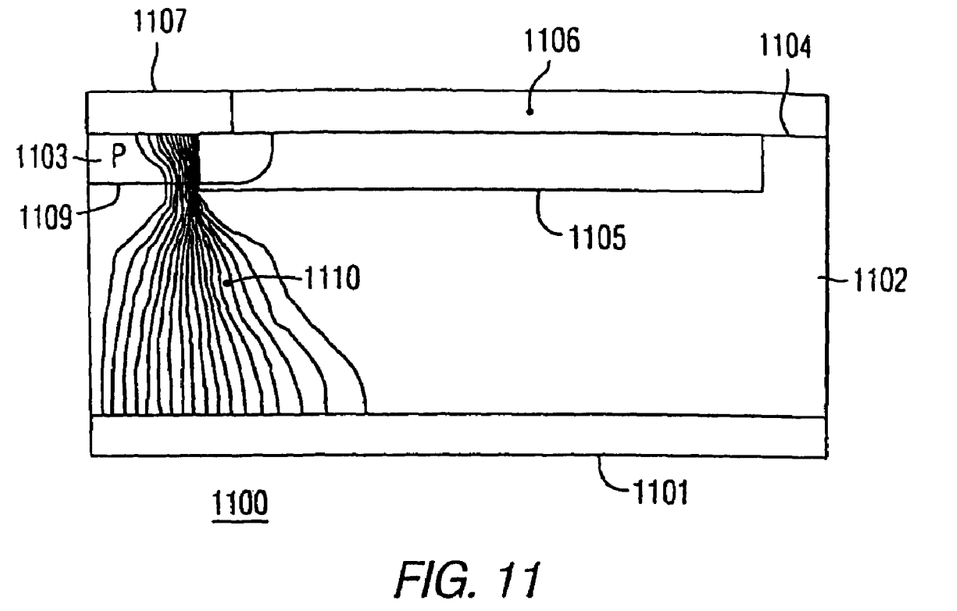
FIGS. 11 and 12 depict the leakage current and electron-hole impact ionization generation contours at the onset of edge breakdown for a second embodiment of the present invention, wherein the die does not include a field plate.
Figure 12:
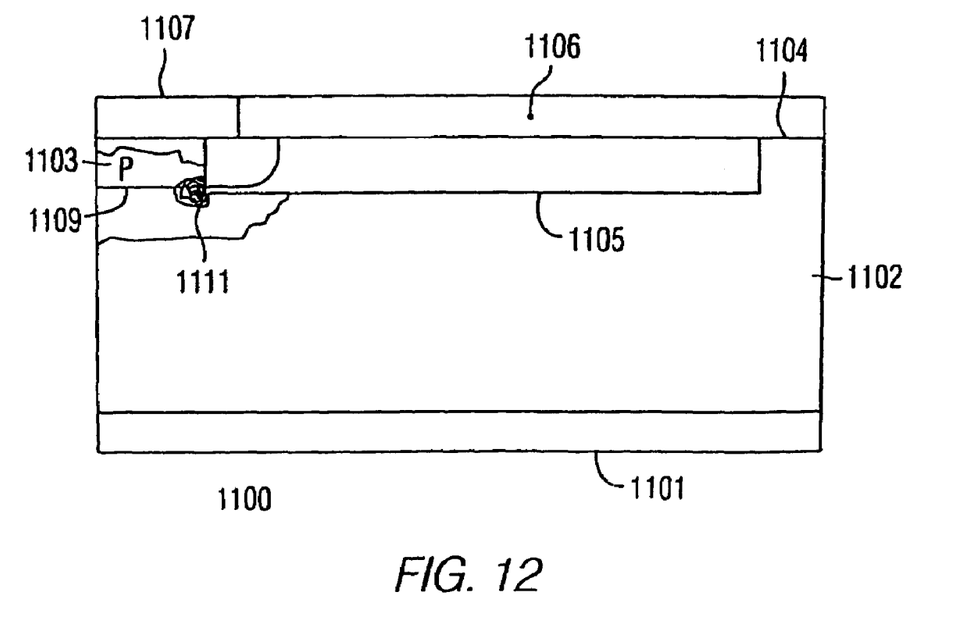

By making the SiC edge layer deeper than the planar PN junction, edge termination with the ideal breakdown voltage can be achieved. Furthermore, the field plate can be omitted without degrading the device breakdown characteristics. FIGS. 11 and 12 illustrate the simulated avalanche leakage current and impact ionization contours, 1110 and 1111, respectively, for die 1100 of the present invention. The breakdown location 1111 is optimally situated at P—N junction parallel plane portion 1109. In addition, the electron-hole generation at upper surface 1104 is extremely low.

Figure 13:
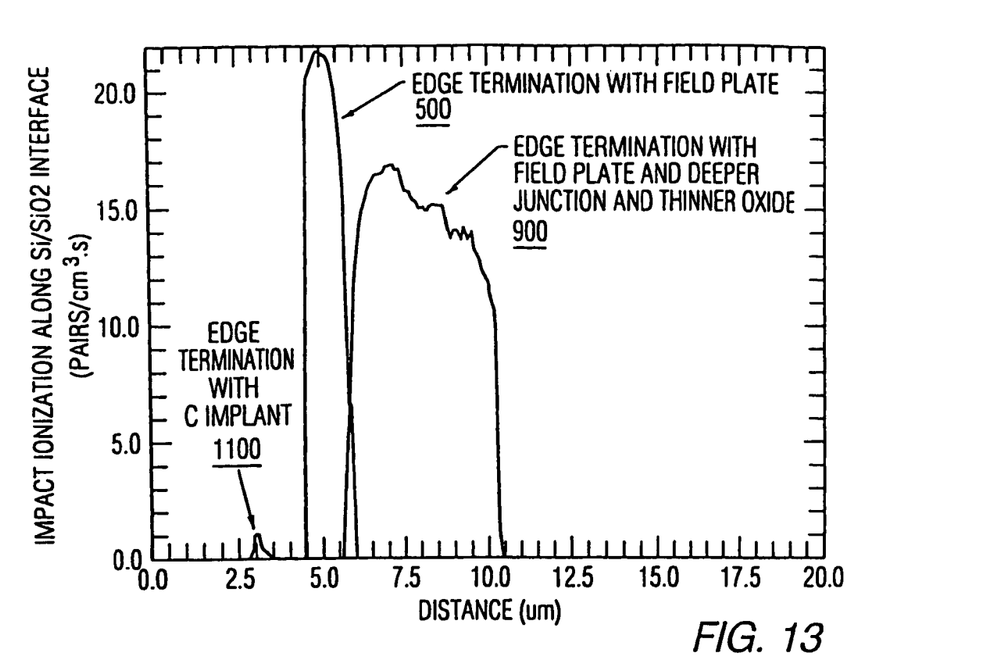
FIG. 13 is a plot comparing electron-bole avalanche generation rates for silicon dies of the prior art and the present invention.

FIG. 13, a plot of impact ionization along the Si/SiO$_2$ interface versus distance from the P—N junction at the interface, depicts the surface carrier generation characteristics of the field plate-containing prior art dies 500 (cf. FIGS. 5,6) and 900 (cf. FIGS. 9,10) shown in FIGS. 5 and 9, along with die 1100 (cf. FIGS. 11, 12) of the present invention. The SiC edge termination included in die 1100 lowers the electron-hole avalanche generation rate more than 20 orders of magnitude compared with prior art die 500, and more than 16 orders of magnitude compared with prior art die 900. Furthermore, the breakdown voltage of die 1100 is desirably increased as a result of the thicker net epitaxial layer, which is defined by the distance between the parallel plane portion 1109 of the PN junction and highly doped substrate 1101.

Another improvement provided by the present invention is a reduction in edge termination area, which is controlled by the width of the surface depletion layer. Edge termination in accordance with the present invention does not change the curvature of the edge planar junction and the equal-potential contour distributions. Therefore the width of the surface depletion layer, which is less than the depletion width of the parallel plane portion, does change. According to the analysis described in the previously mentioned paper of Drabe and Sittig, the area of edge termination in die 1100 is expected to be about half that of the theoretical "ideal" Si edge termination.

Figure 14A:
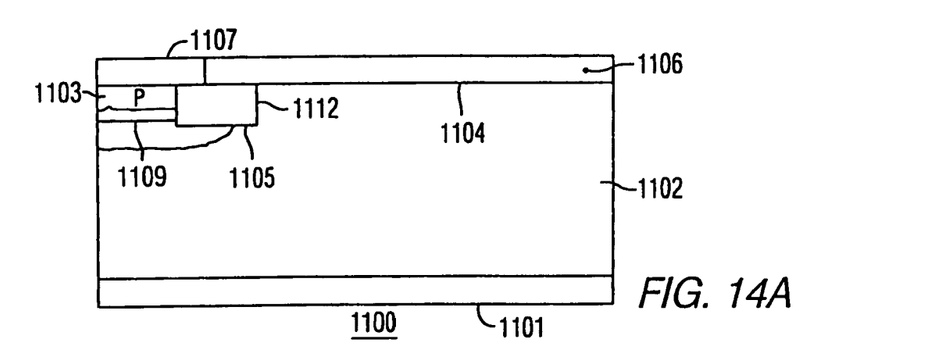
FIGS. 14A and 14B compare surface depletion layer boundaries in dies of the prior art and the present invention.
Figure 14B:
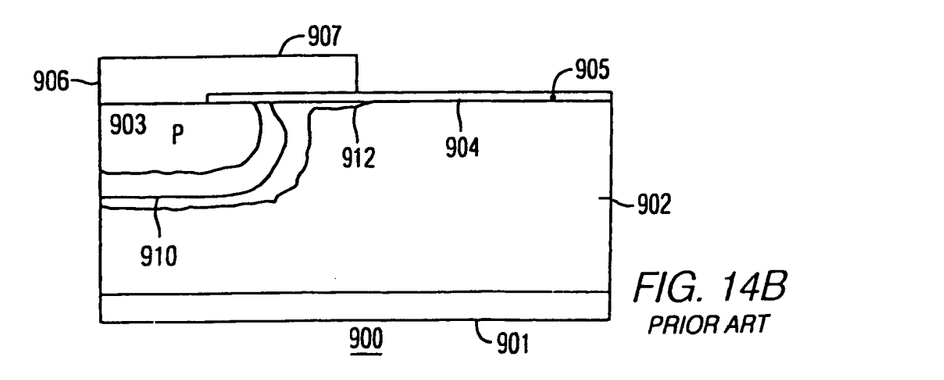

In the absence of any termination structures, the width of the edge zone containing material with a higher critical electrical field than silicon can be chosen to be equal to the width of the surface depletion layer of the edge planar junction. To verify this, the width of the SiC edge zone 1105 in die 1100 (cf. FIG. 12) is reduced to correspond to the surface depletion layer boundary 1112 of the PN junction 1109. The simulated breakdown characteristic does not change, and the breakdown voltage also remains the same. The depletion layer boundary 1112 of die 1100 at the onset of avalanche breakdown is shown in FIG. 14A. The depletion layer boundary 912 of field plate-containing die 900 (cf. FIG. 10) is depicted in FIG. 14B. The width of the depletion layer in prior art die 900 is at least two times greater than that of die 1100 of the present invention.

In addition to the described field plate (FP), the edge termination of the present invention can be advantageously applied in semiconductor dies that include other edge terminating features such as, for example, field limiting rings (FLR), variable lateral doping concentration (VLD), and junction termination extension (JTE).

The present invention has been described in detail for the purpose of illustration, but it is understood that such detail is strictly for that purpose, and variations can be made therein by those skilled in the art without departing from the spirit and scope of the invention, which is defined by the following claims.

What is claimed:

1. A device in an integrated circuit comprising:
    a silicon substrate of a first conductivity type having an upper surface;
    at least a first region in the upper surface of the substrate being of a material having a higher critical field than the silicon;
    a second region of silicon and of a second conductivity type opposite of the first conductivity type in the upper surface of the substrate: and
    wherein the first region is at and forms an edge termination of the junction of the second region and the substrate.

2. The device according to claim 1, wherein the material of the first region includes carbon.

3. The device according to claim 1, wherein the material of the first region includes silicon carbide.

4. The device according to claim 1, wherein the material of the first region is formed by ion implantation into the substrate.

5. The device according to claim 4, wherein carbon is ion implanted.

6. The device according to claim 1, wherein the material of the first region is formed by selective deposition.

7. The device according to claim 1, wherein the material of the first region is formed by selective epitaxial deposition.

8. The device according to claim 1, wherein the first region overlaps the junction the second region and the substrate.

9. The device according to claim 1, wherein the first region is in a recess in the top surface of the substrate.

* * * * *